(12) United States Patent
Ito

(10) Patent No.: US 10,660,251 B2
(45) Date of Patent: May 19, 2020

(54) INSPECTION DEVICE

(71) Applicant: FUJI CORPORATION, Chiryu-shi (JP)

(72) Inventor: Akira Ito, Toyota (JP)

(73) Assignee: FUJI CORPORATION, Chiryu-shi (JP)

( * ) Notice: Subject to any disclaimer, the term of this patent is extended or adjusted under 35 U.S.C. 154(b) by 148 days.

(21) Appl. No.: 15/756,757

(22) PCT Filed: Sep. 2, 2015

(86) PCT No.: PCT/JP2015/074928
§ 371 (c)(1),
(2) Date: Mar. 1, 2018

(87) PCT Pub. No.: WO2017/037887
PCT Pub. Date: Mar. 9, 2017

(65) Prior Publication Data
US 2018/0271001 A1 Sep. 20, 2018

(51) Int. Cl.
*H05K 13/08* (2006.01)
*G01R 31/28* (2006.01)

(52) U.S. Cl.
CPC ......... *H05K 13/08* (2013.01); *G01R 31/2808* (2013.01); *H05K 13/082* (2018.08)

(58) Field of Classification Search
CPC ...... G01R 3/00; G01R 31/2889; G01R 1/067; G01R 31/2886; G01R 1/0483; G01R 1/06; G01R 31/2851
USPC .......................... 324/757.01, 757.03, 759.01
See application file for complete search history.

(56) References Cited

U.S. PATENT DOCUMENTS

| 2013/0249566 A1 | 9/2013 | Huntington |
| 2014/0131510 A1* | 5/2014 | Wang .................... B64C 39/024 244/17.23 |
| 2014/0306843 A1* | 10/2014 | Merkel .................... G01S 3/14 342/385 |

(Continued)

FOREIGN PATENT DOCUMENTS

| JP | 52-30703 | 8/1977 |
| JP | 7-181214 | 7/1995 |

(Continued)

OTHER PUBLICATIONS

Extended European Search Report dated Aug. 9, 2018 in Patent Application No. 15903007.1, 8 pages.

(Continued)

*Primary Examiner* — Giovanni Astacio-Oquendo
(74) *Attorney, Agent, or Firm* — Oblon, McClelland, Maier & Neustadt, L.L.P.

(57) ABSTRACT

In an inspection device, components are separated and collected after electrical characteristics have been measured. The inspection device includes holding table, pair of measuring elements and configured to grip a component held on holding table and measure electrical characteristics of the component; and a relative movement device configured to relatively move holding table and the pair of measuring elements. The components are separated and collected by the relative position of movable element and holding table being changed based on measurement results of the electrical characteristics of the component.

9 Claims, 12 Drawing Sheets

(56) References Cited

U.S. PATENT DOCUMENTS

| | | |
|---|---|---|
| 2015/0089801 A1 | 4/2015 | Cho et al. |
| 2016/0091317 A1* | 3/2016 | Friend .................. G01C 21/165 |
| | | 701/500 |
| 2016/0150687 A1 | 5/2016 | Shibata |
| 2016/0178714 A1* | 6/2016 | Fautz .................. G01R 33/483 |
| | | 324/309 |
| 2017/0319097 A1* | 11/2017 | Amthor .................. A61B 5/055 |
| 2018/0024214 A1* | 1/2018 | Bhat .................. G01R 33/4828 |
| | | 324/309 |
| 2018/0174928 A1 | 6/2018 | Cho et al. |

FOREIGN PATENT DOCUMENTS

| | | |
|---|---|---|
| TW | 201350885 A | 12/2013 |
| WO | 2013/186861 A1 | 12/2013 |
| WO | 2014/203331 A1 | 12/2014 |

OTHER PUBLICATIONS

International Search Report dated Nov. 24, 2015 in PCT/JP2015/074928 filed Sep. 2, 2015.
Combined Chinese Office Action and Search Report dated Aug. 27, 2019 in corresponding Chinese Patent Application No. 201580082802.4 (with English Translation and English Translation of Category of Cited Documents), 11 pages.

\* cited by examiner (a)

(b)

When determined to be suitable (1) Initial state (2) Clamp state (3) Measurement state (4) First collection state
(first housing section selection state)

INSPECTION DEVICE

TECHNICAL FIELD

The present application relates to an inspection device for inspecting components mounted on a circuit board.

BACKGROUND ART

Disclosed in patent literature 1 is an inspection device that measures electrical characteristics of a component loaded on a holding table by sandwiching the component from both sides. In this inspection device, air is supplied from ventilation duct section 28 along a V-groove in the holding table, and a post-measurement component in the V groove is fed to entrance section 7'. Also, multiple receptacles 32i (i=1, 2, 3, . . . ) are provided, with entrance section 7' being rotated to a position corresponding to receptacle 32i based on a measurement result of a component, and the component being collected in that receptacle 32i.

CITATION LIST

Patent Literature

Patent literature 1
JP-S52-30703

BRIEF SUMMARY

Problem to be Solved

An object of the present disclosure is to, in an inspection device capable of automatically measuring an electrical characteristic of a component, and in a state different to that of the inspection device disclosed in patent literature 1, sort and collect components after measurement.

Means for Solving Problem and Effects

An inspection device of the present disclosure includes (1) a holding table, (2) a measuring section provided with a pair of measuring elements capable of gripping a component held by the holding table; (3) a relative movement device configured to relatively move the pair of measuring elements and the holding table; and (4) a sorting and collecting device configured to sort and collect the component released from the pair of measurement elements by changing the relative position of the pair of measuring elements and the holding table. Because components are sorted and collected, compared to a case in which components are simply discarded without being sorted, components can be used more effectively. For example, for a case in which components are separated and collected as suitable component and non-suitable components based on measurement results, it is possible to mount suitable components on a board. Also, based on components that are not suitable, it is possible to identify the cause of the components not being suitable. In an inspection device of the present disclosure, with respect to components being sorted and collected by changing the relative position of the holding table and the pair of measuring elements, in the inspection device disclosed in patent literature 1, after sending a component from the holding table to entrance section 7', components are separated and collected by changing the rotation angle of the entrance section 7', thus, the state of sorting in the inspection device of the present disclosure and the state of sorting in the inspection device disclosed in patent literature 1 are different from each other.

BRIEF DESCRIPTION OF DRAWINGS

FIG. 8(*a*) is when a component is determined to be suitable.

FIG. 8(*b*) is when a component is determined to be not suitable.

FIG. 12 (*b*) is a cross section in a second collection state.

EMBODIMENTS

Figure 1:
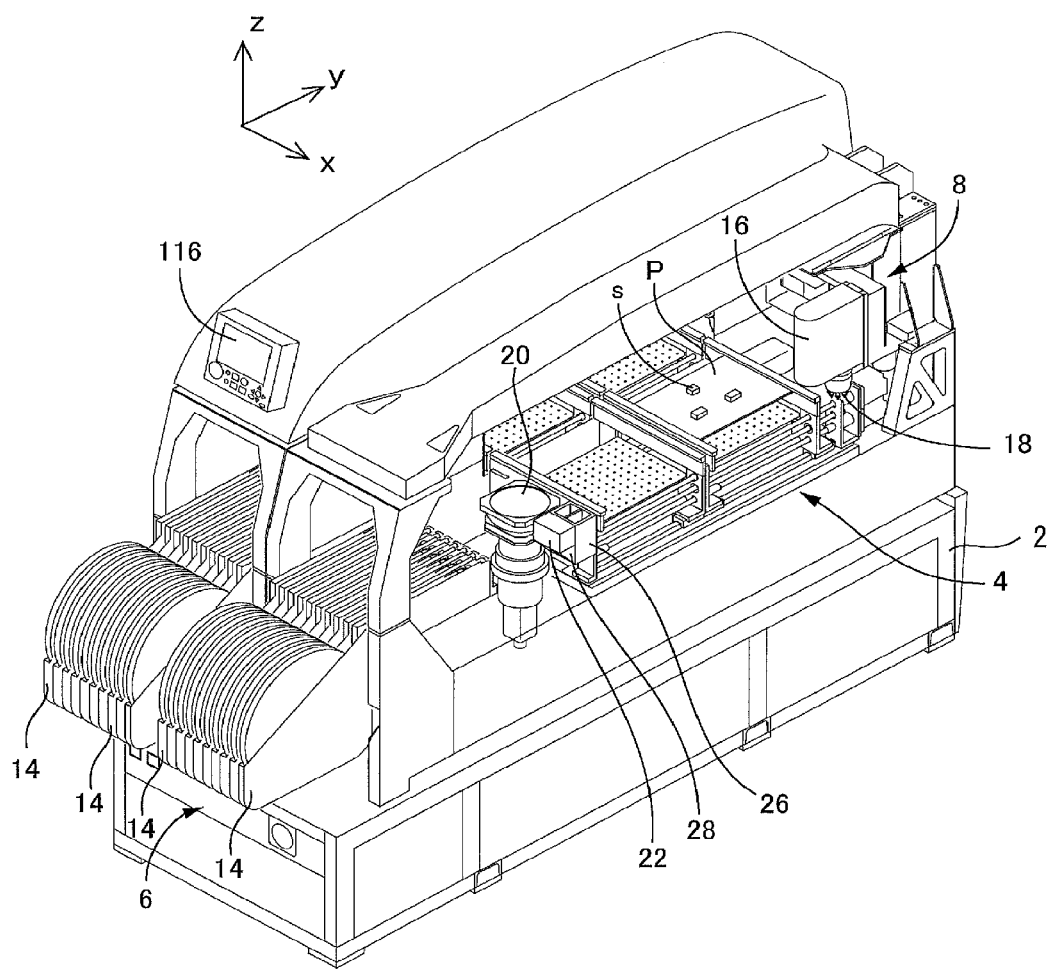
FIG. 1 is a perspective view of a mounting machine including an inspection device that is an embodiment of the present disclosure.

A mounting machine including an inspection device that is an embodiment of the present disclosure is described below in detail with reference to the figures. The mounting machine shown in FIG. 1 is for mounting components on a board and includes items such as device main body 2, circuit board conveying and holding device 4, component supply device 6, and head moving device 8. Circuit board conveying and holding device 4 conveys circuit board P (also referred to as board P) in a horizontal state and holds board P, with the conveyance direction of board P in FIG. 1 being the x direction, the width direction of board P being the y direction, and the thickness direction of board P being the z direction. The y direction and the z direction are respectively the front-rear direction and up-down direction of the mounting machine. The x direction, y direction, and z direction are perpendicular to each other. Component supply device 6 supplies electronic components (also referred to as components) s to be mounted on board P and includes items such as multiple tape feeders 14. Head moving device 8 holds mounting head 16 and moves mounting head 16 in the x, y, and z directions; mounting head 16 includes suction nozzle 18 that picks up and holds a component.

Reference numeral 20 indicates a camera. Camera 20 captures an image of a component s held by suction nozzle 18, and based on an image captured by camera 20, it is determined whether component s is planned to be mounted on circuit board P. Reference numeral 22 indicates an inspection device. Inspection device 22 performs inspection by measuring electrical characteristics of component s. Electrical characteristics of component s are measured, and it is determined if the measured electrical characteristics match information (electrical characteristics) related to components included in the job information, that is, it is determined whether the measured electrical characteristics match the electrical characteristics of the component s planned to be used in the next work. Electrical characteristics of component s correspond to items such as L (inductance), C (capacitance), R (resistance), and Z' (impedance), and at least one of these is measured by inspection device 22.

Figure 2:
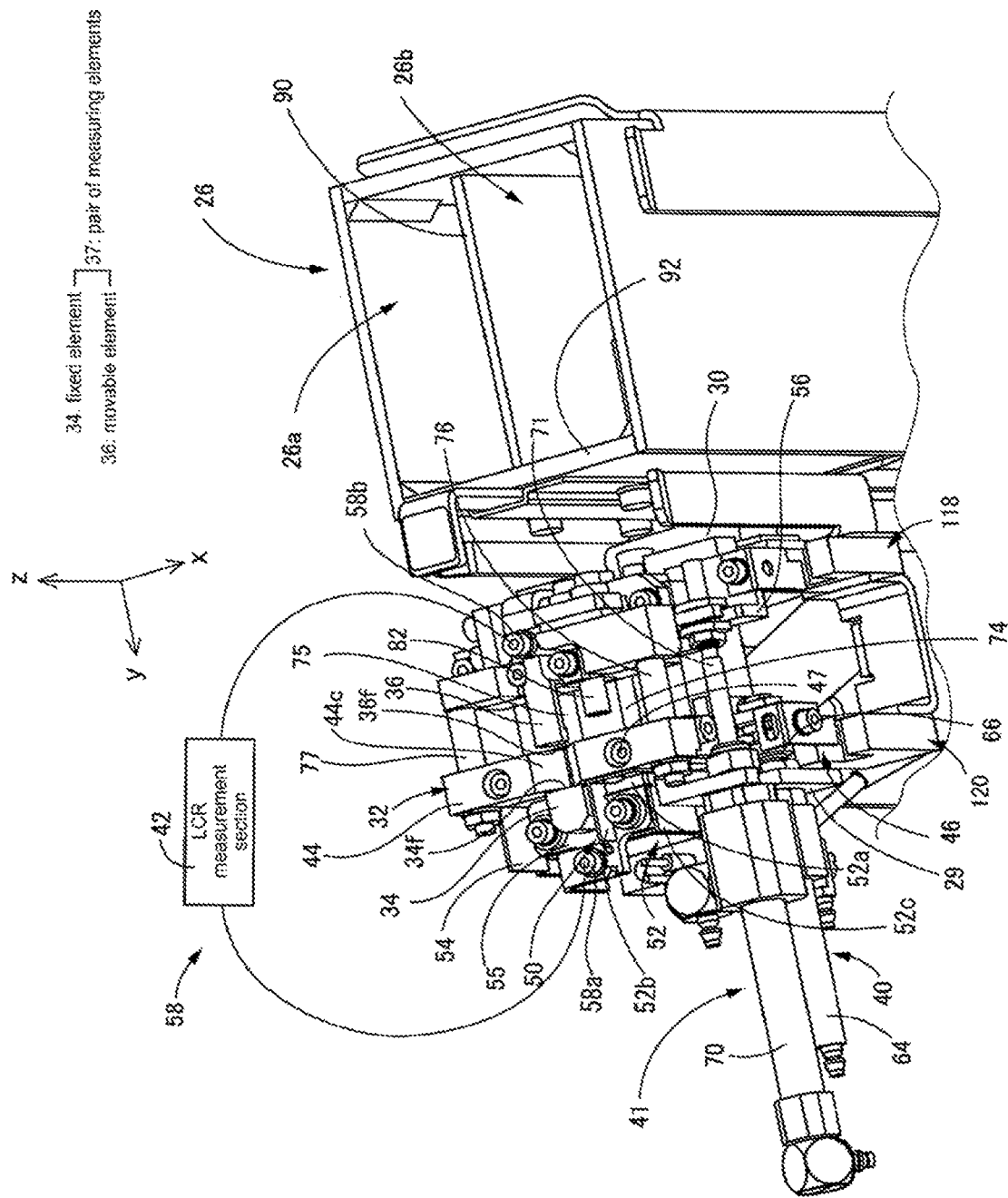
FIG. 2 is a perspective view of main sections of the inspection device.
Figure 3:
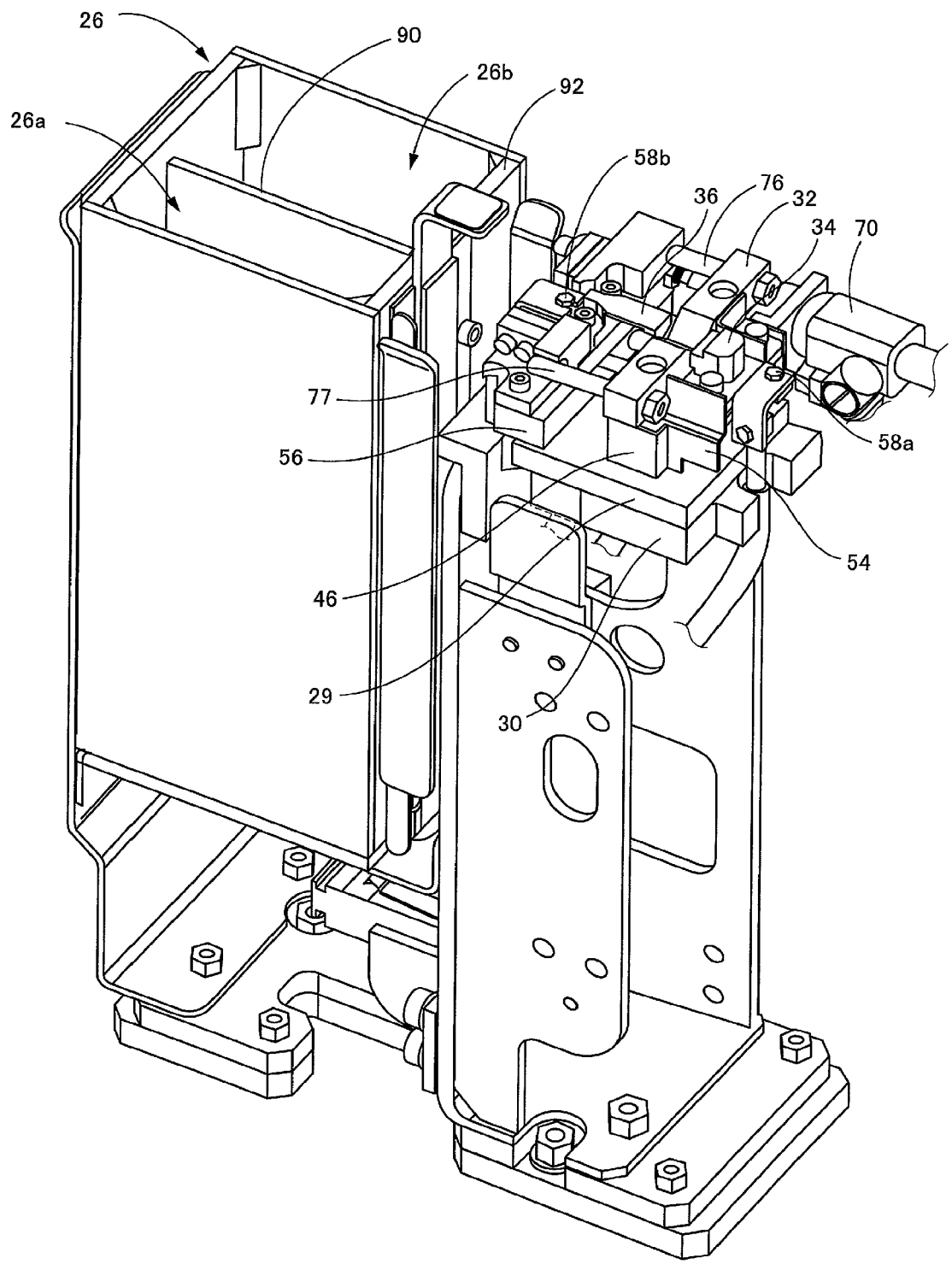
FIG. 3 is a perspective view of main sections of the above inspection device seen from a direction different to that of FIG. 2.
Figure 4:
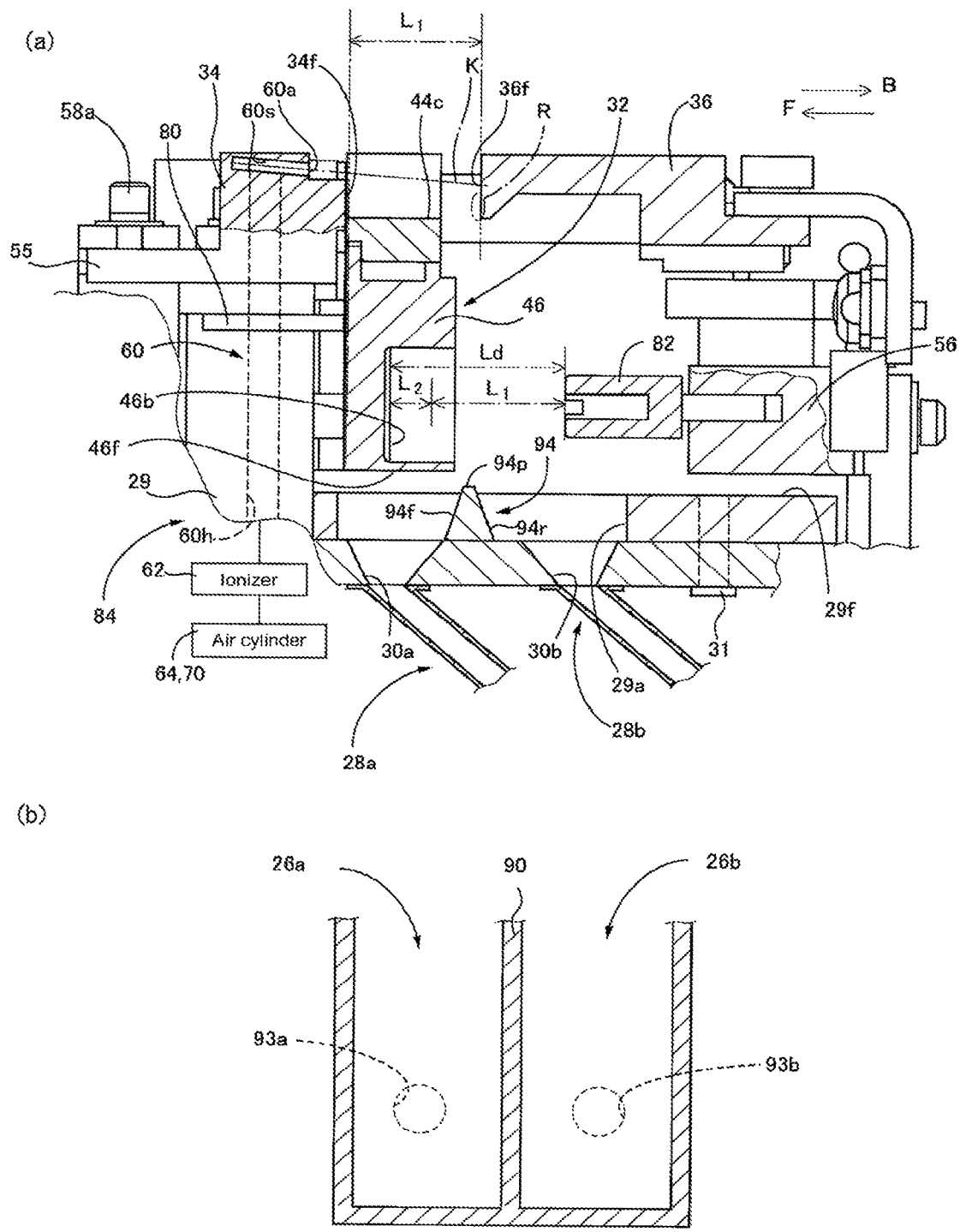
FIG. 4 is a partial cross section of main sections of the inspection device.

Inspection device 22 is provided on the main body of circuit board conveying and holding device 4 via collection box 26. Collection box 26 and inspection device 22 are connected by collection passage 28, and components s for which the electrical characteristics have been measured are housed in collection box 26 via collection passage 28. Inspection device 22 is provided on collection box 26 such that the height is adjustable. As shown in FIGS. 2 and 3, base section 30 is engaged with collection box 26 so as to be able to be raised and lowered, and main body 29 is fixed to base section 30 by fastening section 31 (refer to FIG. 4) that includes bolts and nuts, such that base section 30 and main body section 29 are held so as to be able to be raised and lowered as one body. As shown in FIGS. 2 to 4, inspection device 22 includes items such as: (i) the above main body section 29 and base section 30; (ii) holding table 32 capable of holding component s; (iii) a pair of measuring elements 37 formed from fixed element 34 and movable element 36; (iv) holding table moving device 40 that moves holding table 32; (v) movable element moving device 41 that moves movable element 36 towards and away from fixed element 34; and (vi) LCR measurement section 42 as an electrical characteristics inspection section. In the embodiment, component s has electrodes at both ends so as to be able to be gripped by the pair of measuring elements 37. For example, so-called rectangular chips may apply as component s.

Holding table 32 includes component loading section 44, and loading section holding body 46 that holds component loading section 44. Component loading section 44 extends approximately in the x direction, and V groove 44c is formed on an upper surface at an intermediate portion of component loading section 44; each end of V groove 44c is fixed to loading section holding body 46 via fastening section 47. Because the portion on which component s is loaded is V-shaped in this manner, the position of component s is decided accurately. Component loading section 44 is conductive and abrasion-resistant, and is manufactured of a material that does not oxidize easily. Component loading section 44 is electrically connected to base section 30 via multiple members with conductivity, and by base section 30 being grounded, component loading section 44 is also grounded. In the present embodiment, component loading section 44 contacts loading section holding body 46, and is fixed by fastening section 47, and loading section holding body 46 contacts main body 29 via stopper 80 (refer to FIG. 4), and main body 29 is fixed to base section 30 by fastening section 31. Further, loading section holding body 46, stopper 80, main body 29, base section 30, fastening sections 31 and 47, and the like are conductive. Thus, component loading section 44 is grounded (earthed). In this manner, by component loading section 44 being manufactured from a conductive material and being grounded, static charge can be eliminated from a component s loaded on component loading section 44. Also, component loading section 44 is manufactured from a material that is abrasion-resistant, so wear on component loading section 44 is curtailed, thus improving durability. Further, because component loading section 44 is manufactured from a material does not oxidize easily, that is, from a material on which a passivation film that is a metal oxidation film can be formed, component loading section 44 does not rust easily. Because rust does not easily get on component s, lowering of the measurement accuracy of electrical characteristics of component s is curtailed. For example, component loading section 44 may be manufactured from an aluminum alloy or stainless steel. Loading section holding body 46 is formed substantially as a cuboid and extends in the x direction and the z direction. Lower surface 46f of loading section holding body 46 reaches a position close to upper surface 29f of main body section 29.

Fixed element 34 and movable element 36 each include opposing surfaces 34f and 36f that oppose each other, and component s is gripped by this pair of opposing surfaces 34f and 36f. Fixed element 34 is fixed to main body section 29 via fixed element holding body 55. Moving element 36 is held to be movable together with movable element holding body 56, and is able to move towards and away from fixed element 34. In the present embodiment, opposing surface 36f has a triangular cross section, and is movable along V groove 44c. In other words, the shape of opposing surface 36f of movable element 36 is formed to substantially correspond to V groove 44c, and opposing surface 36f of movable element 36, opposing surface 34f of movable element 34, and V groove 44c of holding table 32 are positioned at substantially the same height. Therefore, wherever component s is inside V groove 44c, the component s can be gripped by the pair of opposing surfaces 34f and 36f. Also, movable element 36, in the present embodiment, is a long member stretched in the y direction (moving direction), and is held by movable member holding body 56 at the retract end. Further, a section further to the rear than the leading end section including opposing surface 36f is formed in a shape without a portion that protrudes in the x direction from the leading end section. Therefore, when holding table 32 and movable element 36 are moved relatively to each other, holding table 32, in a state in which the bottom section of V groove 44 is positioned below movable member 36, is able to move in a forwards direction and a backwards direction with respect to opposing surface 36f. Further, electric circuit 58 is formed including the pair of measuring elements 37 consisting of movable element 36 and fixed element 34, LCR measurement section 42, a power source device that is not shown, and the like. When current is supplied between fixed element 34 and movable element 36, the current flowing is detected, and based on this relationship, electrical characteristics of component s are measured by LCR measurement section 42. LCR measurement section 42 is not limited to measuring L, C, and R, LCR measurement section 42 may measure one or more of a physical quantity that represents items such as L, C, R, and Z'. Note that, reference symbols 58a and 58b of FIG. 2 are the connection sections of the pair of measuring elements 37 to electric circuit 58.

Cover section 50 is attached to holding table 32. Cover section 50 curtails diffusion of air and includes a pair of cover plates 52 and 54 provided spaced apart from each other in the x direction at both ends of V groove 44c. Cover plate sections 52 and 54 are each provided on the fixed element 34 side of holding table 32, and are formed extending in the y direction and z direction, that is, the moving direction of holding table 32 and movable element 36 and the vertical direction, and as a plate member that is bent. Cover plate section 52 is channel-shaped when seen in plan view, and includes bottom plate section 52a and side plate sections 52b and 52c provided at each side of bottom plate section 52a spaced apart in the x direction. Bottom plate section 52a has a bent lower section so as to form an L-shape when viewed from the side, and an upper section thereof is attached to a side surface on the fixed element 34 side of component loading section 44. Also, at the advanced end position of holding table 32, a lower section of bottom plate section 52 is above fixed element holding body 55, side plate section 52b is positioned to the outside of fixed element 34 and above fixed element holding body 55, and side plate section 52c is positioned to the outside of side plate section 52b and to the outside of fixed element holding body 55. Side plate section 52c has a vertical dimension longer than that of side plate section 52b, and a lower end section thereof extends close to through-hole 29a of main body section 29. Cover plate section 54 is attached to loading section holding body 46 on the opposite side of cover plate section 52 with respect to V groove 44c. Cover plate section 54 is positioned to the outside of fixed element holding body 55 at the advanced end position of holding table 32. Cover plate section 54 is formed bent in a direction crossing the vertical direction, and the lower end section thereof extends close to through-hole 29a of main body section 29. Also, the y direction dimension of cover plate section 54 and side plate section 52c is a size to cover a large portion of the space in the x direction between the pair of opposing surfaces 34f and 36f in a first collection state, which is described later.

Figure 5:
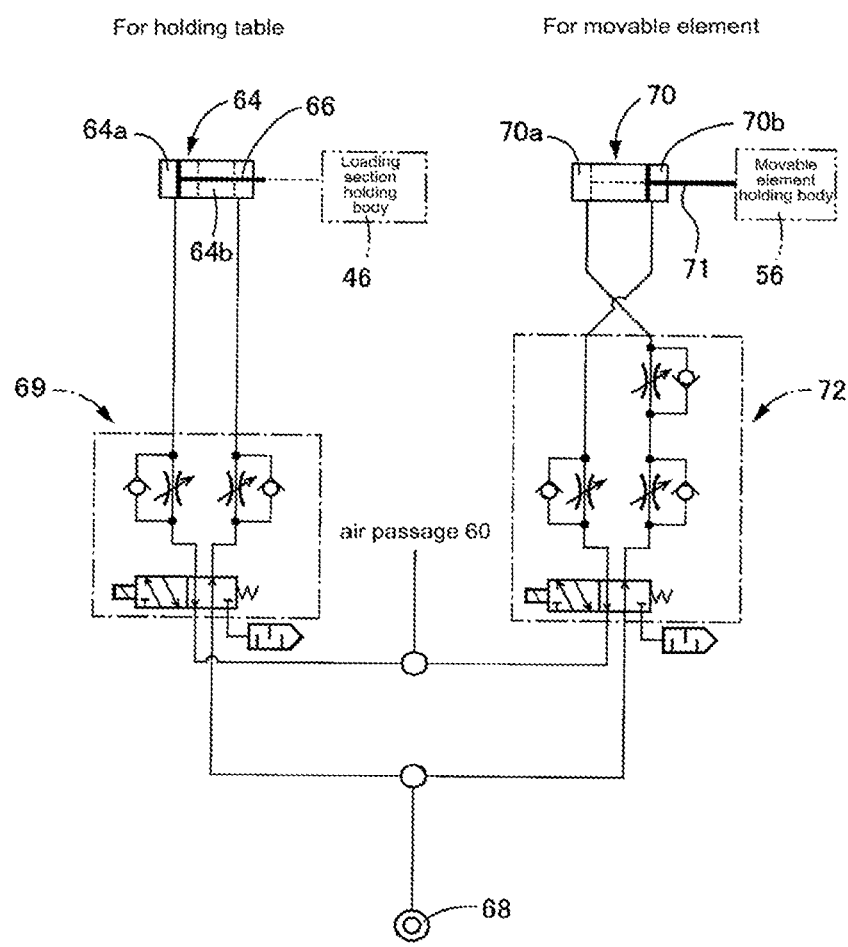
FIG. 5 is a diagram of an air circuit included in the inspection device.

Holding table moving device 40 includes air cylinder 64 as a driving source fixedly provided on main body section 29 or base section 30. Piston rod 66 (refer to FIG. 5) of air cylinder 64 is connected to loading section holding body 46. Piston rod 66 extends approximately in the y direction, such that loading section holding body 46 is movable in the y direction. Air cylinder 64 includes two air chambers, 64a and 64b, divided by a piston inside the cylinder housing, and electromagnetic valve device 69 is provided between the two air chambers 64a and 64b, and air source 68, air passage 60 that is described later (refer to FIG. 4), and a filter (atmosphere). Electromagnetic valve device 69 includes at least one electromagnetic valve, for example, as shown in FIG. 5, a direction changing valve, or a variable valve. The moving direction of loading section holding body 46 is controlled by a direction changing valve, and the movement and stopping of loading section holding body 46 is controlled by a variable valve. Holding table 32 is advanced forwards (moved in the direction of arrow F in FIG. 4) by air source 68 being connected to air chamber 64b and air passage 60 being connected to air chamber 64a by electromagnetic valve device 69, and holding table is retracted backwards (moved in the direction of arrow B in FIG. 4) by air chamber 64b being opened to the atmosphere and air source 68 being connected to air chamber 64a by electromagnetic valve device 69.

Movable element moving device 41 includes air cylinder 70 as a driving source fixedly provided on main body section 29. Movable element holding body 56 that is able to be moved together with the movable element is connected to piston rod 71 of air cylinder 70. Piston rod 71 also extends in the y direction, such that movable element 36 is also movable in the y direction. Air source 68, air passage 60, and a filter (atmosphere) are connected to two air chambers, 70a and 70b, that are divided by a piston inside the housing of air cylinder 70 via electromagnetic valve device 72. Electromagnetic valve device 72 includes at least one electromagnetic valve, for example, a direction changing valve, or a variable valve. Movable element 36 is retracted backwards by air chamber 70b being connected to air passage 60 and air chamber 70a being connected to air source 68 by electromagnetic valve device 72, and movable element 36 is advanced forwards by air chamber 70a being opened to the atmosphere and air chamber 70b being connected to air source 68 by electromagnetic valve device 72.

A pair of guide rods 74 and 75 that extend in the y direction are provided between movable element holding body 56 and main body section 29, and a pair of guide rods 76 and 77 that extend in the y direction are provided between holding table 32 and movable element holding body 56. An end section of guide rods 74 and 75 is connected to movable element holding body 56, and the other end is slidably engaged with main body section 29. Guide rods 76 and 77 are connected to loading section holding body 46 at one end, and are slidably engaged with movable element holding body 56. By these guide rods 74, 75, 76, and 77, holding table 32 and movable element 36 are relatively movable in the y direction with respect to main body section 29, and moving table 32 and movable element 36 are relatively movable in the y direction with respect to each other. Also, as shown in FIG. 4, stopper 82 is provided on the fixed element side of movable element holding body 56, and stopper 80 is provided on a portion of main body section 29 that holds fixed element holding body 55. Stopper 82 regulates how close together movable element holding body 56 and holding table 32 (loading section holding body 46) are; stopper 80 regulates how close together fixed element 34 (main body section 29) and holding table 32 (loading section holding body 46) are. Note that, as shown in FIG. 4, recess 46b concave in the y direction is formed in an intermediate portion of loading section holding body 46 on the movable element 36 side, and the bottom section of recess 46b can contact stopper 80. Therefore, the distance by which holding table 32 and movable element 36 can move relative to each other is large. In the present embodiment, guide rods 74 to 77 are shared between holding table moving device 40 and movable element moving device 41, and stoppers 80 and 82 can be thought of as configuration elements of holding table moving device 40.

Air supply device 84 capable of supplying air to opposing surface 36f of movable element 36 is provided on the present inspection device. Air supply device 84 includes the above cover section 50, air passage 60, ionizer 62, air cylinders 64 and 70, and the like. As shown in FIG. 4, air passage 60 includes passage portion 60h provided in main body section 29 and extending in a vertical direction, and passage portion 60s provided in a member (for example, an upper section of fixed element 34, a portion above fixed element 34 of fixed element holding body 55, or main body section 29) on the fixed element side and extending approximately in the y direction. Passage portion 60s extending in the y direction is slanted downwards the closer it is to movable element 36, and when movable member 36 is at a position separated from fixed element 34, extension line k extends in a state reaching above portion R or inside portion R of opposing surface 36f of movable element 36. Portion R is a portion with a high frequency of gripping component s of opposing surface 36f of movable element 36 and may be referred to as a gripping portion. Also, an end section of passage portion 60s acts as opening 60a that faces opposing surface 36f of movable element 36. Therefore, passage portion 60s may be referred to as an air ejection passage. Air cylinders 64 and 70 are connected to air passage 60. Also, ionizer 62 is provided at the downstream side of air cylinders 64 and 70 of air passage 60. Ionizer 62 creates a corona discharge to ionize the air, such that ionized air is supplied to opposing surface 36f. Note that, the construction of electromagnetic valve devices 69 and 72 is not limited to the present embodiment. For example, one three-position valve may be used, or multiple open-close valves may be used. Also, ionizer 62 is not essential.

Figure 10:
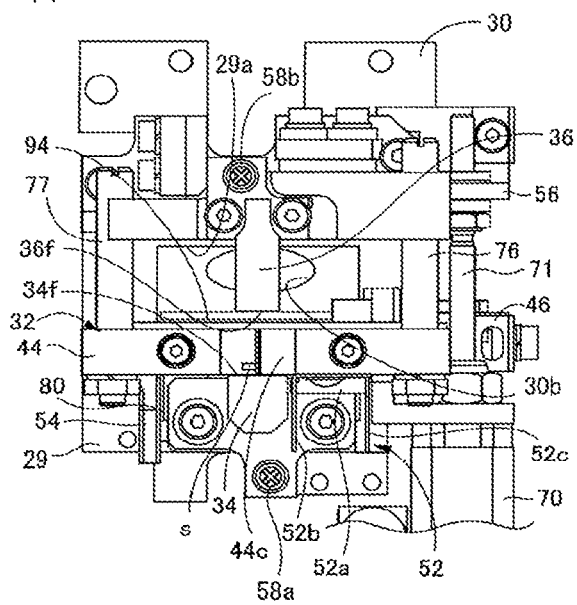
FIG. 10 is a plan view showing operation of the above inspection device, in particular operation in a case in which a component is determined to be suitable. (1) shows an initial state; (2) shows a clamped state; (3) shows a measurement state; and (4) shows a first collection state.
Figure 10:
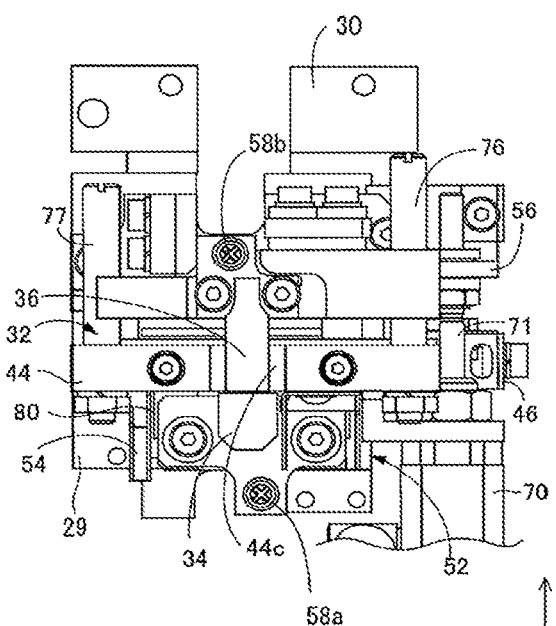
Figure 10:
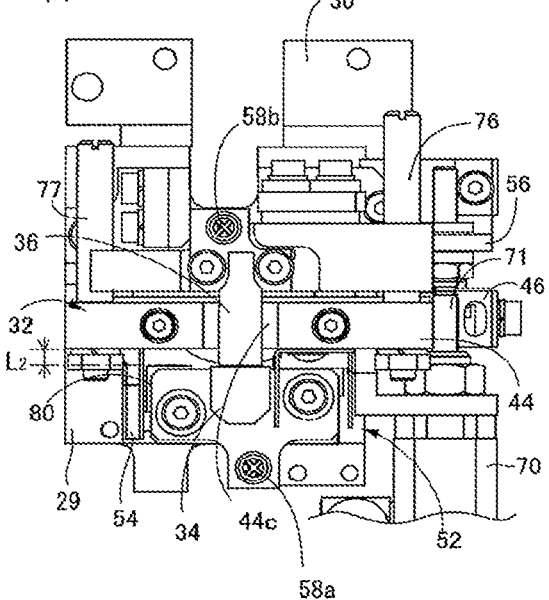
Figure 10:
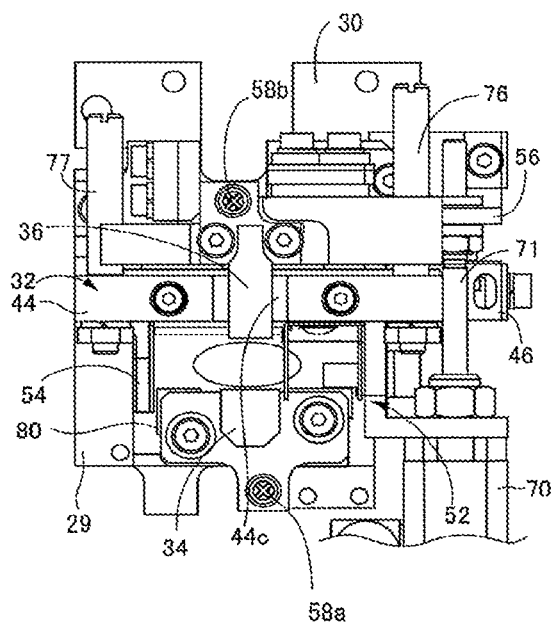

As shown in FIGS. 4(a) and 10(1), through-hole 29a that is substantially quadrilateral in plan view is provided in main body section 29, and first and second through-holes 30a and 30b are each provided in base section 30. First and second through-holes 30a and 30b are formed along the movement direction of holding table 32 and movable element 36, that is, are formed lined up separated from each other in the y direction. Further, through-hole 29a formed in main body section 29 and first and second through-holes 30a and 30b formed in base section 30 respectively pierce through main body section 29 and base section 30 in a vertical direction, and are positioned such that a portion thereof overlaps with a portion of the others in a plan view. Therefore a hole is formed piercing main body section 29 and base section 30 in the vertical direction via through-hole 29a and first and second through-holes 30a and 30b.

The inside of collection box 26 is divided into two in the x direction by dividing plate 90, the two portions being referred to as first housing section 26a and second housing section 26b. First collection opening 93a and second collection opening 93b are respectively provided separated in the x direction on side wall 92 on the inspection device 22 side of collection box 26, that is, at both sides of dividing member 90. The above first and second collection passages 28a and 28b are respectively connected at one end to first and second through-holes 30a and 30b of base section 30, with the other end being inserted into first and second collection opening 93a and 93b of collection box 26 such that relative movement is possible. Therefore, a component s entering first through-hole 30a is collected in first housing section 26a via first collection passage 28a, and a component s entering second through-hole 30b is collected in second housing section 26b via second collection passage 28b, such that components s are separated and collected in first housing section 26a and second housing section 26b. Note that, the configuration is such that base section 30, collection box 26, and first and second collection passages 28a and 28b are allowed to move relatively in the vertical direction with respect to collection box 26, for example, as above, first and second collection passages 28a and 28b are relatively movable with respect to collection box 26 to be able to be engaged, or first and second collection passages 28a and 28b may be made to be expandable and contractible, or the like.

Further, the surface area of each opening of first through-hole 30a and second through-hole 30b is formed to become smaller going down, that is, the side surfaces of first and second through-holes 30a and 30b are formed sloping. Therefore, the opening on the entrance side for components s can be made larger while the cross section areas of first and second collection passages 28a and 28b become smaller, such that a component s released from the pair of measuring elements 37 can be favorably collected in first and second collection passages 28a and 28b. On the other hand, separating wall 94 extending in a direction perpendicular to the movement direction of holding table 32 and movable element 36, that is, the x direction, is provided at a portion between first through-hole 30a and second through-hole 30b of base section 30. Separating wall 94 is formed getting thinner (in the y direction) towards the top, with top section 94p reaching between upper surface 29f of main body section 29 and lower surface 46f of loading section holding body 46. Also, front side surface 94f of separating wall 94 slopes towards first through-hole 30a towards the bottom, and rear side surface 94r slopes towards second through-hole 30b towards the bottom. Therefore, a component s falling on front side surface 94f of separating wall 94 is favorably housed in first housing section 26a via first through-hole 30a and first collection passage 28a, and a component s falling on rear side surface 94r of separating wall 94 is favorably housed in second housing section 26b via second through-hole 30b and second collection passage 28b. Note that, in the present embodiment, the length of separating wall 94 in the x direction is about the same as through-hole 29a of main body section 29, but it is suitable as long as the length is longer than first and second through-holes 30a and 30b.

Figure 6:
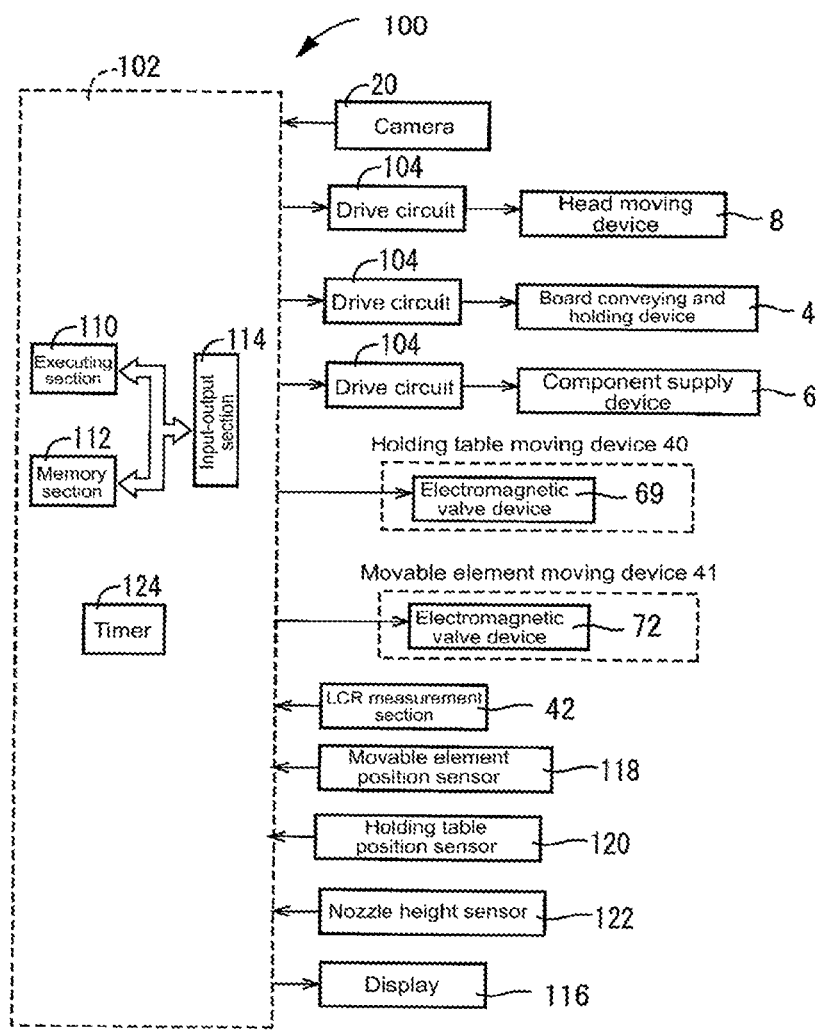
FIG. 6 schematically shows a control device of the mounting machine.

The mounter includes control device 100. As shown in FIG. 6, control device 100 includes controller 102 configured mainly of a computer, and multiple drive circuits 104. Controller 102 includes items such as executing section 110, memory section 112, and input-output section 114, with each of board conveying and holding device 4, component supply device 6, and head moving device 8 being connected to input-output section 114 via a drive circuit 104, and items such as holding table moving device 40 and electromagnetic valve devices 69 and 72 of movable element mounting device 41 also being connected to input-output section 114. Also connected are items such as LCR measurement section 42, display 116, movable element position sensor 118, holding table position sensor 120, and nozzle height sensor 122 for detecting the height of nozzle 18. Memory section 112 stores multiple programs and tables such as the LCR measurement program shown in the flowchart of FIG. 7. Also, time measurement is performed by timer 124 provided on controller 102. Note that, in the present embodiment, descriptions are given in a case in which overall control of the mounter is performed by control device 100, but control of items such as board conveying and holding device 4, component supply device 6, and head moving device 8 may be performed by individual control devices.

Operation of the mounter is described below. When changeover and so on is performed, in cases such as when a new tape feeder 14 is set, or when a tape feeder 14 is exchanged, electrical characteristics of the component s held by that tape feeder 14 are measured, and it is determined whether that tape feeder 14 (or that component s) is appropriate. Also, the inspection result is displayed on display 116. If the result indicates the tape feeder 14 or component s is not appropriate, the tape feeder 14 is replaced. Further, a component s that has been determined to be suitable is collected in first housing section 26a, while a component s that has been determined to be not suitable is collect in second housing section 26b, such that components s for which electrical characteristics have been measured are sorted and collected into suitable and not suitable components.

Figure 7:
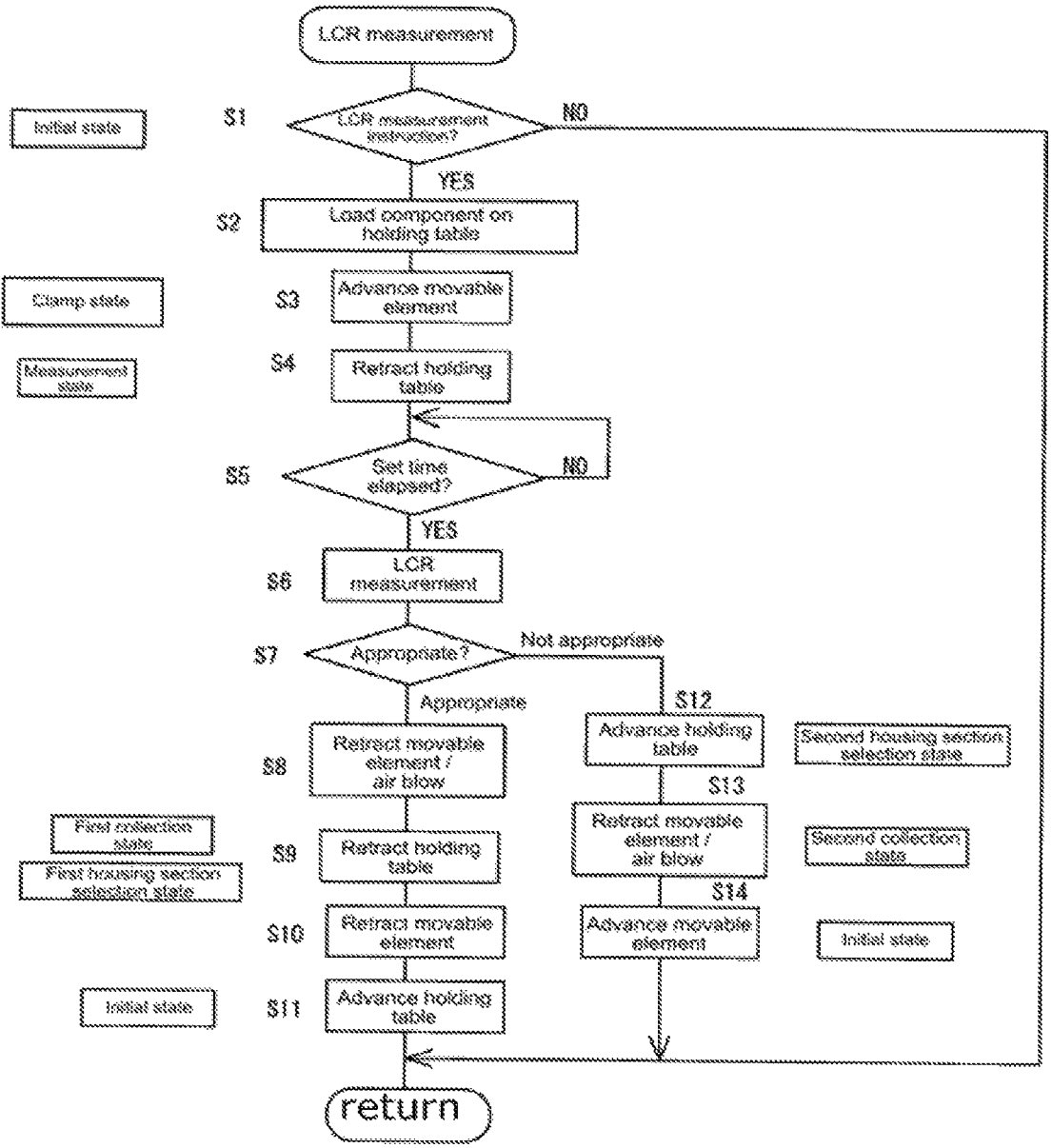
FIG. 7 is a flowchart showing an LCR measurement program memorized on a memory section of the control device.
Figure 8:
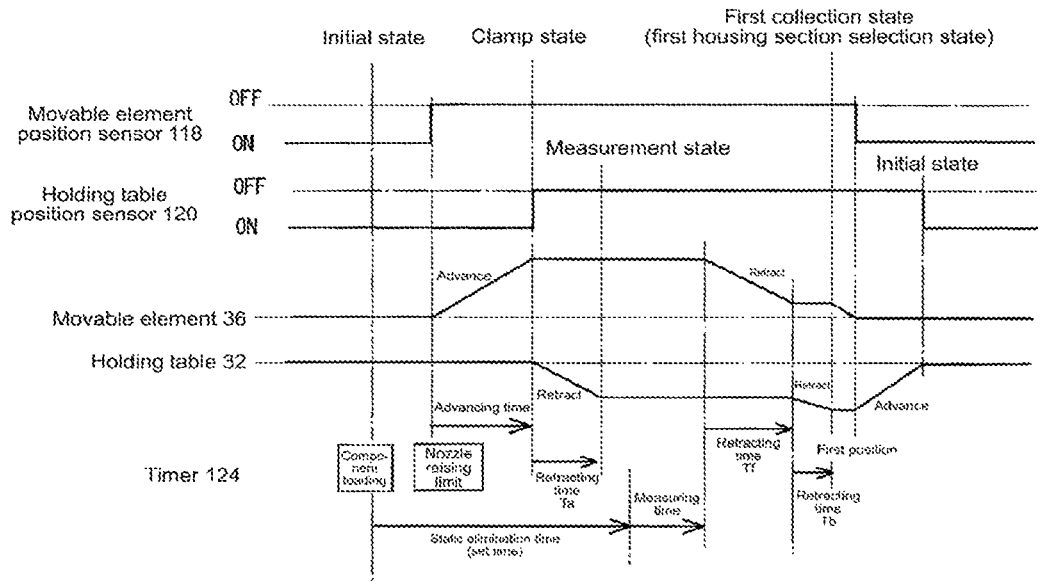
FIG. 8 is a time chart when performing LCR measurement at the above inspection device.
Figure 8:
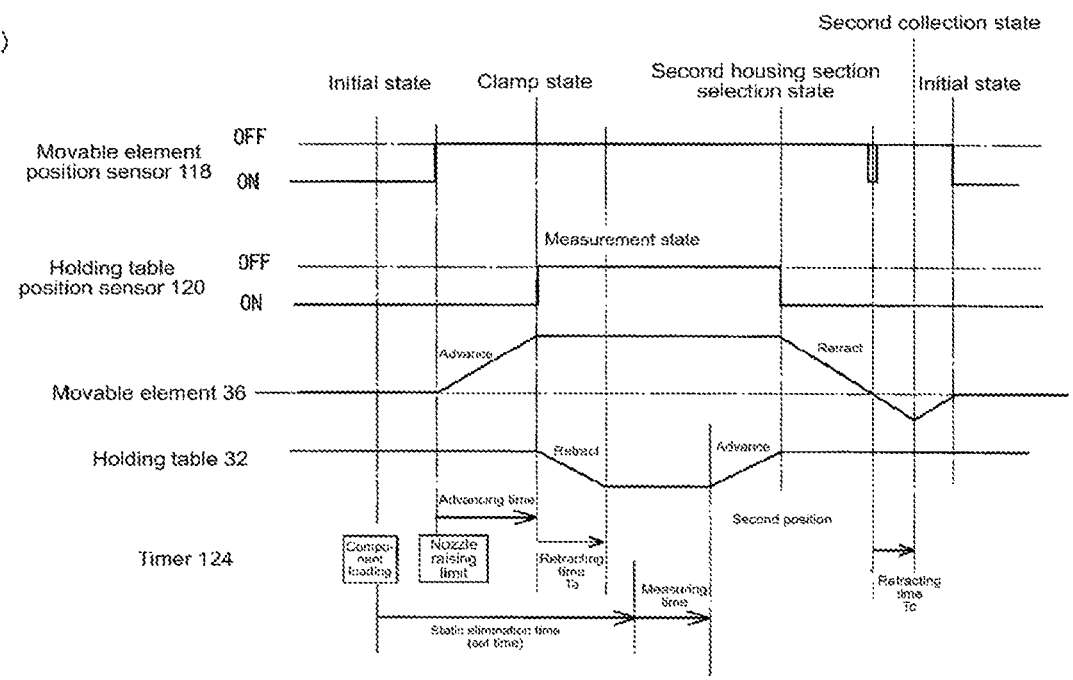
Figure 9:
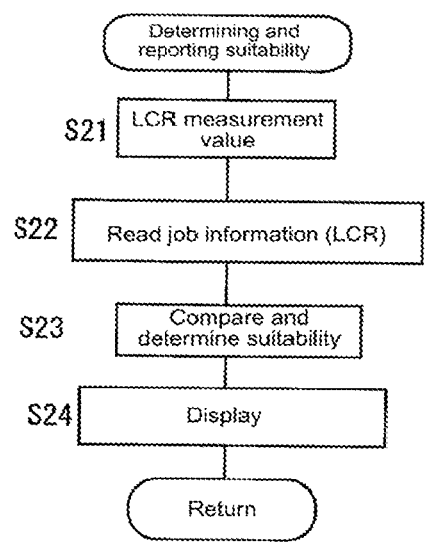
FIG. 9 is a flowchart showing a component suitability determination program memorized on the above memory section.

Electrical characteristics of component s are measured by performing the LCR measurement program shown in the flowchart of FIG. 7. Also, time charts when an LCR measurement program is performed are shown in FIGS. 8(a) and 8(b). Inspection device 22 is normally in the initial state shown in FIG. 10(1). Movable element 36 is at the start position at which movable element position sensor 118 is on, and movable table 32 is at the advanced end position, that is, at a position contacting stopper 80, at which holding table position sensor 120 is on. In this state, component loading section 44 of holding table 32 is in an earthed state. Movable element 36 is not above V groove 44c of holding table 32, so component s can be loaded. Also, cover section 50 is positioned on both sides of fixed element 34 (separated in the x direction). In step 1 (hereinafter also referred to as S1, with similar notation used for other steps), it is determined whether an instruction for measuring electrical characteristics of component s has been output. In a case in which changeover is performed or the like, an instruction for measuring electrical characteristics is output. When the measurement instruction is output, in S2, mounting head 16 is moved, for example, and suction nozzle 18 picks up a component s held by a newly attached tape feeder 14, and loads the component s on V groove 44c of holding table 32. For example, suction nozzle 18 is lowered and component s is released such that component s is loaded on V groove 44c.

Then, the fact that suction nozzle 18 has loaded component s on V groove 44c and reached the upper limit is detected by nozzle height sensor 122, and in S3, movable element 36 is advanced by controlling electromagnetic valve 72, and movable element position sensor 118 turns from on to off. Opposing surface 36f of the edge of movable member 36 is advanced forwards along V groove 44c of component loading section 44, and component s is clamped by opposing surface 36f and opposing surface 34f of fixed element 34 (refer to FIG. 10). In the present embodiment, stroke L1 (refer to FIG. 4) of movable element 36 from the start position to the clamping of component s is decided by the size and so on of the component s to be clamped, and is thus decided in advance. After advancing of movable element 36 is started, when the time required for movable element 36 to advance stroke L1 has elapsed, advancing of movable member 36 is stopped by performing variable control. The advancing time is measured by timer 124. Holding table 32 is at the advanced end position and component s is held in a clamped state by the pair of opposing surfaces 34f and 36f.

In S4, holding table 32 is retracted by control of electromagnetic valve device 69, and holding table position sensor 120 is switched from on to off. Holding table 32 is retracted until contacting with stopper 82 (refer to FIGS. 10[3] and 11[3]), and is held at that position. The stroke of holding table 32 between those positions is $L_2$ (refer to FIG. 4).

$$L_2 = Ld - L1$$

In the present disclosure, stroke $L_2$ is equal to or greater than set value $L_x$ ($L_2 \ L_x$), and component loading section 44 is separated from component s by at least $L_x$. When a conductive material (component loading section 44) is positioned near component s when electrical properties are being measured, static induction occurs, leading to occurrences of an eddy current or the like, meaning that the electrical properties cannot be detected correctly. With respect to this, if component loading section 44 is separated from component s by set value $L_x$ or greater (that is, if the minimum distance between component loading section 44 and component s is set value $L_x$ or greater), measurement errors of the electrical characteristics that occur due to component loading section 44 being close to component s can be reduced. In this manner, set value $L_x$ is a distance for which component loading section 44 has little effect on the measurement of electrical characteristics of component s, and is a value acquired by performing experiments in advance or the like. This state is a measuring state. Note that, when time required Ta from the starting of retracting of holding table 32 to holding table 32 retracting stroke $L_2$ has elapsed, holding table 32 is held in position by controlling electromagnetic valve device 69. Retracting time Ta is measured by timer 124.

In S5, component s is released by suction nozzle 18, and the system waits from the time that the component s was loaded on V groove 44 c for a set static elimination time. Each of the components s held by tape feeder 14 is in an electrified state due to static that occurs because of vibration and contact with items that happens during transport by tape feeder 14. Electrified component s is made of a conductive material, and has static removed by being loaded on earthed component loading section 44, and due to static discharge into the air. Static elimination time is the time required to remove the amount of static electricity that component s is estimated to have, and is decided by experiments performed in advance or the like, or is logically decided based on the size and specific characteristics of component s. When the time elapsed since component s was loaded on component loading section 44 has reached the de-electrification time, the determination in S5 is yes, and the electrical characteristics of component s are measured in S6. Then, when the measuring time required for measuring the electrical characteristics has elapsed, S7 is performed, wherein the measuring time may be decided based on the type of component or the like, or may be a fixed time. In either case, this time is acquired in advance and memorized.

Figure 12:
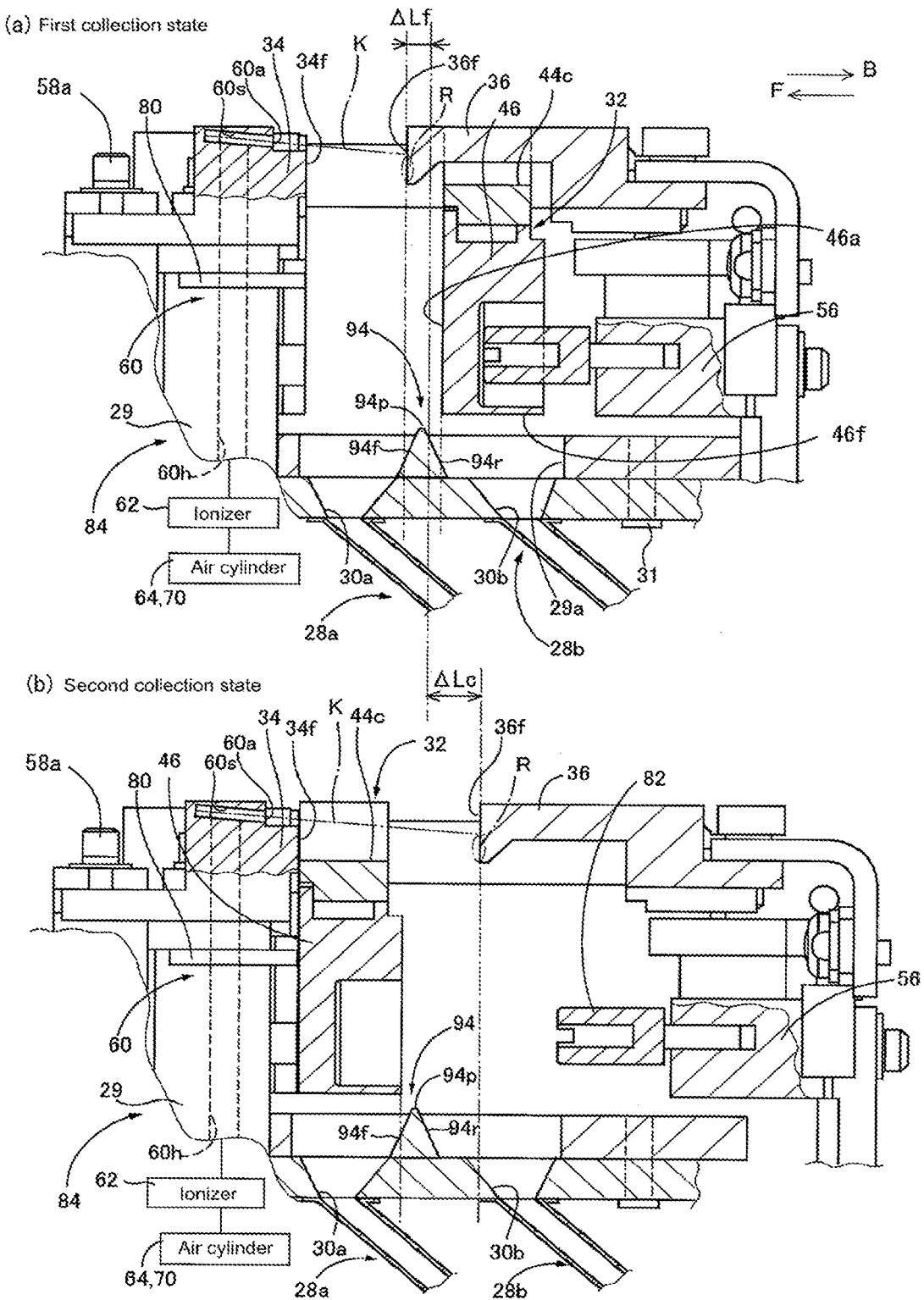
FIG. 12(*a*) is a cross section of the above inspection device in a first collection state.

When the measurement time has elapsed and measurement of electrical characteristics of the component s is complete, in S7, as described below, the determination result of whether component s was suitable (OK) or not suitable (NG) is read. If the component is suitable, in S8 and S9, movable element 36 is retracted and holding table 32 is retracted. Movable element 36 is retracted to a position further forward than the start position by ΔLf (refer to FIG. 12[a]) by control of electromagnetic valve device 72. Movable element 36 is stopped after retract time Tf has elapsed, retract time Tf being the time required to retract from (a) the measurement state position, that is, the position at which component s was gripped, to (b) the position further forward than the start position by ΔLf. Holding table 32 is retracted from the measurement state position to a position where movable element 36 contacts stopper 82 by control of electromagnetic valve device 69. Because the stroke of holding table 32 is ($L_1$−ΔLf), after retract time Tb, which is the required for holding table 32 to retract by stroke ($L_1$−ΔLf), has elapsed, holding table contacts stopper 82 and is stopped. Note that, in FIG. 12(a), the position of opposing surface 36f of movable element 36 that is at the start position is shown by the two-dashed broken line. Opposing surface 36f of movable element 36 moves away from opposing surface 34f of fixed element 34, and thus the component s held between them is released. Also, when movable element 36 is retracted, air chamber 70b of air cylinder 70 is connected to air passage 60, and cover plate sections 52 and 54 are positioned at both ends in the x direction of the space between the pair of opposing surfaces 34f and 36f. Further, as shown in FIGS. 10(4) and 12(a), holding table 32 is positioned to the rear of opposing surface 36f of movable element 36, and the space between pair of opposing surfaces 34f and 36f connects to first through-hole 30a. In accordance with the retraction of movable element 36, air flowing out from air chamber 70a is ejected from opening 60a, and supplied from diagonally upwards to opposing surface 36f of movable element 36. Air, after mainly contacting opposing surface 36f, flows down along opposing surface 36f. Therefore, even if component s failed to fall from opposing surface 36f and adhered to portion R, the component would be favorably made to fall, and collected in first housing section 26a. Also, a component s that falls from opposing surfaces 34f and 36f and lands on holding table 32 is made to fall into first through-hole 30a by the advancing of opposing surface 36f of movable element 36 in accordance with the retraction of holding table 32. Further, because the space between opening 60a and opposing surface 36f is covered from the x direction by cover section 50, diffusion of air is favorably curtailed.

Also, as shown in FIG. 12(a), holding table 32 is separated from above first through-hole 30a, and positioned substantially above second through-hole 30b, in other words, at the first position further to the rear than top section 94p of separating wall 94. Therefore, component s released from the pair of measuring elements 37 does not fall into second through-hole 30b easily. Opposing surface 36f of movable element 36 is positioned forward of top section 94p of separating wall 94, and front surface 46a of loading section holding body 46 of holding table 32 is positioned rearwards of top section 94p of separating wall 94. Therefore, even if component s falls down due to air being supplied to opposing surface 36f, the component s does not fall easily into second through-hole 30b further to the rear than opposing surface 36f due to separating wall 94 and loading section holding body 46. Opposing surface 36f of the movable element is positioned above sloped surface 94f on the front side of separating wall 94. Therefore, component s that has fallen down is favorably housed in first housing section 26a by falling along the sloped surface 94f on the front side of separating wall 94 and the sloped side surface of first through-hole 30a. This state is the first collection state and the first housing section selection state. In the present embodiment, by performing S8 and S9 of the LCR measurement program, this state is made the first housing state and the first housing section selection state.

Then, in S10, movable element 36 is retracted to the start position. By controlling electromagnetic valve device 72, movable element 36 is retracted until movable element position sensor 118 turns from off to on. In S11, by controlling electromagnetic valve device 69, at air cylinder 64, air chamber 64b is connected to air source 68, and air chamber 64a is connected to air passage 60. Holding table 32 is advanced and when contacting stopper 80, holding table position sensor 120 turns on. Holding table 32 is positioned between the pair of opposing surfaces 34f and 36f (V groove 44c is positioned below opposing surfaces 34f and 36f), and there is an empty space above V groove 44c. Therefore, a component s can be loaded. This is the initial state.

Figure 11:
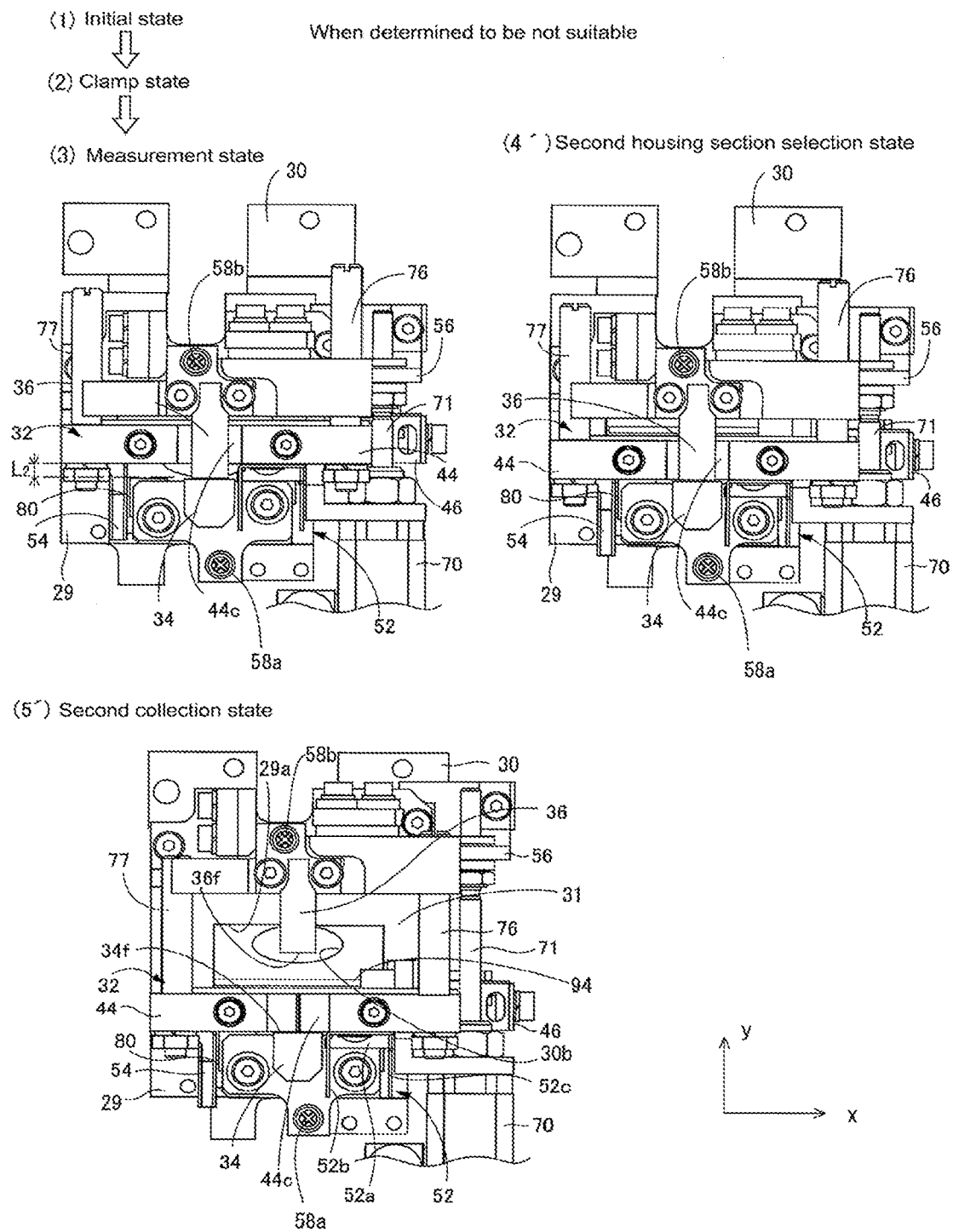
FIG. 11 is a plan view showing operation of the above inspection device, in particular operation in a case in which a component is determined to be not suitable. (1) shows an initial state; (2) shows a clamped state; (3) shows a measurement state; and (4') shows a collection section selection state. (5') shows a second collection state.

In contrast, in a case in which the measured component s is determined to be not suitable, in S12, as shown in FIG. 11(4'), holding table 32 is advanced until holding table position sensor 120 turns on, that is, until holding table 32 contacts stopper 80. In this state, holding table 32 is separated from above second through-hole 30b and is positioned at the second position above first through-hole 30a. This state is referred to as the second housing selection state. Next, in S13, as shown in FIGS. 11(5') and 12(b), movable element 36 is retracted until retraction time Tc has elapsed, retraction time Tc being a predetermined time from when movable element position sensor 118 turned on. In other words, movable element 36 is retracted to a position to the rear of the start position by ΔLc, and opposing surface 36f is positioned above second through-hole 30b to the rear of holding table 32, that is, to the rear of separating wall 94. Therefore, component s released from the pair of measuring elements 37 falls substantially straight down due to the air, and is housed in second housing section 26b via second through-hole 30b and second collection passage 28b. In such a case, because holding table 32 is positioned above first through-hole 30a, component s is favorably prevented from being collected in first through-hole 30a. Also, lower surface 46f of loading section holding body 46 of holding table 32 extends substantially above first through-hole 30a. Therefore, air that contacts opposing surface 36f does not easily flow forward due to loading section holding body 46 or separating wall 94. Air contacting loading section holding body 46 or separating wall 94 flows to the rear, such that component s is favorably collected in second housing section 28b. This state is the second collection state. In the present embodiment, after making the second housing section selection state, this is taken as the second collection state. Then, in S14, movable element 36 is advanced until movable element position sensor 118 turns on (the start position), which is taken as the initial state.

On the other hand, the measured electrical characteristics and electrical characteristics included in the job information are compared, it is determined whether the component s is the correct component to be used in the subsequent work (job) to be performed, that is, it is determined whether the component s is suitable for the work about to be performed, and the determination result is displayed on display 116. In S21, measurement values of the electrical characteristics of the component s are acquired, and in S22, information corresponding to the next job is read from the job information. In S23, these are compared and it is determined whether they match. In the case of a match, component s is determined to be suitable, and in case of no match, component s is determined to be not suitable. In either case, the determination result is displayed on display 116. In the event of no match, work of exchanging appropriate tape feeders or the like is performed.

As described above, with the present embodiment, it is possible to separate and collect components s after measurement into suitable and not suitable components. Therefore, it is possible to use suitable components s in assembly such as mounting electronic components on a circuit board. In this case, when ionized air is supplied, it is possible to remove static of component s, which is particularly effective when re-mounting a component s. Also, if a component s is not suitable, it is possible to identify the cause of the component not being suitable.

As described above, in the present embodiment, a relative movement device is configured from holding table moving device 40, movable element moving device 41 and so on. Also, a sorting and collecting device is configured from a section that memorizes S8, S9, S12, and S13 of the LCR measurement program of controller 102, an executing section, movable element position sensor 118, holding table position sensor 120, timer 124, and so on. A holding table moving control section is configured from a section that memorizes S9 and S12 from the above, an executing section for S9 and S12, and the like; a movable element position control section is configured from a section that memorizes S8 and S13, an executing section for S8 and S13, and the like; a housing section selection section is configured from a section that memorizes S9 and S12, an executing section for S9 and S12, and so on; and a relative position changing section is configured from a holding table moving control section, a movable element position control section, and the like. Further, a main body may be configured from main body section 29, base section 30, and the like, or may be configured from a base section and the like. Also, holding table 32 may be referred to as a shutter that prevents component s from entering one of first and second through-holes 30a or 30b.

Note that, it is possible to move both of the measurement elements, and to fix the holding table to the main body. In this case too, it is possible change the relative positional relationship between the holding table and the movable element, such that components s can be selectively collected in first housing section 26a or second housing section 26b. Also, in an embodiment above, components s are sorted and collected based on suitability, but components s may be separated and collected based on measurement values of electrical characteristics of the components. Further, components may be sorted and collected based on both suitability and measurement values (for example, a resistance value). Also, in an embodiment above, an air supply device supplies air in conjunction with operation of air cylinders 64 and 70, but air may be supplied to opposing surface 36f directly from air source 68 without any relationship with operation of air cylinders 64 and 70. In this case, as soon as the first collection state or the second collection state is reached, air may be supplied to opposing surface 36f. Further, component s may be sucked in by being selectively sucked in from one of first through-hole 30a or second through-hole 30b. Also, it is not essential that a state the same as the initial state is achieved depending on whether component s is determined to be unsuitable or suitable, and in each case, the measurement program may be performed from a different state. The stroke may be suitably determined depending on the position of the movable element and the holding table in the initial state. In this case, S14 is not required. Further, in a case in which the component is suitable, the position of the movable element in the first collection state may be made the position of the movable element in the initial state. In this case, S10 is not required. Also, S8 and S9 may be performed in parallel, S10 and S11 may be performed in parallel, and so on. Further, when component s is suitable, it is housed in first housing section 26a, and when component s is not suitable, it is housed in second housing section 26b, however, this is not essential. When component s is suitable, it may be housed in second housing section 26b, and when component s is not suitable, it may be housed in first housing section 26a. Further, movable element position sensor 118 and holding table position sensor 120 are not essential. For example, electromagnetic valve devices 69 and 72 may be controlled by measurement by timer 124. Also, in addition to the disclosed embodiments, the present disclosure may be modified and improved based on knowledge of someone skilled in the art, such as the air supply device is also not essential.

REFERENCE SIGNS LIST

22: inspection device; 26: collection box; 28: collection passage; 29: main body section; 30: base section; 31: fastening section; 32: holding table; 34: fixed element; 36: movable element; 34f, 36f: opposing surface; 40: holding table moving device; 41: movable element moving device; 42: LCR measurement section; 44: component loading section: 44c: V groove; 50: cover section; 84: air supply device; 100: control device; 118: movable element position sensor; 120: holding table position sensor; 124: timer (1) An inspection device provided in a mounter that picks up a component supplied from a component supply device and mounts the component on a circuit board, the inspection device comprising:

a holding table configured to hold a component;

a measuring section provided with a pair of measuring elements configured to move towards and away from each other so as to grip and release the component, and configured to measure electrical characteristics of a component using the pair of measuring elements;

a relative movement device configured to relatively move the pair of measuring elements and the holding table; and a sorting and collecting device configured to separate and collect the component released from the pair of measurement elements by relatively moving the pair of measuring elements and the holding table by control of the relative movement device based on measurement results of the electrical characteristics of the component as measured by the measurement section. Components, for example, may be sorted and collected base on measurement results of electrical characteristics, or based on determination of suitability based on measurement results. (2) The inspection device of (1) may include a main body including a first through-hole and a second through-hole formed with an interval between them along a direction of the relative movement of the pair of measuring elements and the holding table by the relative movement device. The main body includes at least two through-holes, a first through-hole and a second through-hole, and may include three or more through-holes. (3) The inspection device of (2) may further include a separating wall provided on the main body between the first through-hole and the second through-hole. (4) The inspection device of (2) or (3) may include a first storage section and a second storage section each configured to store a component released from the pair of measuring elements, a first collection passage configured to connect the first housing section and the first through-hole, and a second collection passage configured to connect the second housing section and the second through-hole. (5) With the inspection device of any of (2) to (4), the surface area of the opening of each of the first through-hole and the second through-hole may be formed to become smaller going down. That is, the side surfaces of the first through-hole and the second through-hole are sloped.

(6) With the inspection device of any one of (1) to (5), the relative moving device may include a holding table moving device configured to move the holding table, and the relative movement control device may include a holding table movement control section configured to control the holding table moving device based on the measurement results so as to change the relative position of the holding table and the pair of measuring elements that have been separated from each other.

(7) The inspection device of (6) may include a main body including a first through-hole and a second through-hole formed with an interval between them in the direction of the relative movement between the holding table and the pair of measuring elements due to a relative movement device, wherein the holding table moving device moves the holding table above the first through-hole and the second through-hole of the main body, and the holding body movement control section includes a first storage section selection section that moves the holding table to a first position above the second through-hole and separated from a position above the first through-hole, and a second position above the first through-hole and separated from a position above the second through-hole. With the holding table at the first position, a component can be collected from the first through-hole, and with the holding table at the second position, a component can be collected from the second through-hole. When the holding table is described as being positioned above the first through-hole and the second through-hole respectively, this means substantially above, it does not necessarily mean that a lower surface of the holding table covers the entire area of the opening of the respective first through-hole and second through-hole. For example, a portion of the area of the opening of the first through-hole and the second through-hole may be outside the lower surface of the holding table.

(8) With the inspection device of any one of (1) to (7), the pair of measuring elements may include a fixed element that is fixed to the main body, and a movable element capable of moving away from and towards the fixed element, with each of the fixed element and the movable element including an opposing surface capable of gripping the component, and the inspection device may further include a main body including a first through-hole and a second through-hole formed with an interval between them in the direction of relative movement between the holding table and the pair of measuring elements by the holding table moving device, and, the sorting and collecting device may include a relative position changing section configured to, by controlling the relative movement device based on the measurement results, switch to and from a first state in which the holding table is positioned above the second through-hole and the opposing surface of the movable element is positioned on the first through-hole side with respect to the holding table, and a second state in which the holding table is positioned above the first through-hole and the opposing surface of the movable element is positioned on the second through-hole side with respect to the holding table.

(9) The inspection device of (6) may include a main body including a first through-hole and a second through-hole formed with an interval between them, and a separating wall of the main body provided between the first through-hole and the second through-hole, and the holding table moving device may move the holding table above the first through-hole, the second through-hole of the main body, and the separating wall; and the holding body movement control section may include a storage section selection section that, by controlling the holding table moving device, moves the holding table to a third position on the second through-hole side of the separating wall, and a fourth position on the first through-hole side of the separating wall. The first position and the third position may be the same position or different positions; similarly, the second position and the fourth position may be the same position or different positions.

(10) With the inspection device of any one of (1) to (7), the pair of measuring elements may include a fixed element that is fixed to the main body, and a movable element capable of moving away from and towards the fixed element, with each of the fixed element and the movable element including an opposing surface capable of gripping the component, and the inspection device may further include a main body including a first through-hole and a second through-hole formed with an interval between them in the direction of relative movement between the holding table and the pair of measuring elements by the holding table moving device, and a separating wall of the main body provided between the first through-hole and the second through-hole; and, the sorting and collecting device may include a second relative position changing section configured to, by controlling the relative movement device based on the measurement results, switch to and from a third state in which the holding table is positioned to the second through-hole side of the separating wall and the opposing surface of the movable element is positioned to the first through-hole side of the separating wall, and a fourth state in which the holding table is positioned to the first through-hole side of the separating wall and the opposing surface of the movable element is positioned to the second through-hole side of the separating wall. The first state and the third state, and the second state and the fourth state, may respectively be the same state or different states.

(11) With the inspection device of (8), the relative movement device may include a movable element moving device that moves the movable element, and the relative position changing section may include a movable element position control section that changes the position of the movable element in the second state to a position different to the position in the first state.

(12) With the inspection of any one of (1) to (11), the pair of measuring elements may include a fixed element that is fixed to the main body, and a movable element capable of moving away from and towards the fixed element, with each of the fixed element and the movable element including an opposing surface capable of gripping the component, and the inspection device may further include an air supply device configured to supply air to the opposing surface of the movable element when the pair of measuring elements are separated from each other.

(13) The inspection device of (12) may further include a movable element moving device provided with a movable element cylinder that moves the movable element towards and away from the fixed element via operation of the movable element cylinder, and the air supply device may include a drive source interacting supply section configured to supply air ejected from the movable element cylinder in accordance with the movable element moving towards and away from the fixed element to a surface opposing the movable element.

The invention claimed is:

1. An inspection device provided in a mounter that picks up a component supplied from a component supply device and mounts the component on a circuit board, the inspection device comprising:
   a holding table configured to hold a component;
   a measuring section provided with a pair of measuring elements configured to move towards and away from each other so as to grip and release the component, and configured to measure electrical characteristics of a component using the pair of measuring elements;
   a relative movement device configured to relatively move the pair of measuring elements and the holding table; and
   a sorting and collecting device configured to separate and collect the component released from the pair of measurement elements into one of a plurality of collection devices by relatively moving the pair of measuring elements and the holding table between entrances of the collection devices by control of the relative movement device based on measurement results of the electrical characteristics of the component as measured by the measurement section.

2. The inspection device according to claim 1, further comprising
   a main body including a first through-hole and a second through-hole formed with an interval between them along a direction of the relative movement of the pair of measuring elements and the holding table by the relative movement device.

3. The inspection device according to claim 2, further comprising
a separating wall provided on the main body between the first through-hole and the second through-hole.

4. The inspection device according to claim 2, further comprising
(a) a first housing section and a second housing section each configured to store a component released from the pair of measuring elements, (b) a first collection passage configured to connect the first housing section and the first through-hole, and (c) a second collection passage configured to connect the second housing section and the second through-hole,
wherein an opening surface area of each of the first through-hole and the second through hole becomes smaller progressing downwards.

5. The inspection device according to claim 1, wherein
the pair of measuring elements includes a fixed element that is fixed to the main body, and a movable element capable of moving away from and towards the fixed element, with each of the fixed element and the movable element including an opposing surface capable of gripping the component, and
the inspection device further includes
a main body including a first through-hole and a second through-hole formed with an interval between them in the direction of relative movement between the holding table and the pair of measuring elements by the holding table moving device,
wherein the sorting and collecting device includes a relative position changing section configured to, by controlling the relative movement device based on the measurement results, switch to and from a first state in which the holding table is positioned above the second through-hole and the opposing surface of the movable element is positioned on the first through-hole side with respect to the holding table, and a second state in which the holding table is positioned above the first through-hole and the opposing surface of the movable element is positioned on the second through-hole side with respect to the holding table.

6. The inspection device according to claim 1, further comprising:
a main body including a first through-hole and a second through-hole formed with an interval between them along a direction of the relative movement of the pair of measuring elements and the holding table by the relative movement device, wherein
the first through-hole and the second through-hole are the entrances to two of the collection devices.

7. An inspection device provided in a mounter that picks up a component supplied from a component supply device and mounts the component on a circuit board, the inspection device comprising:
a holding table configured to hold a component;
a measuring section provided with a pair of measuring elements configured to move towards and away from each other so as to grip and release the component, and configured to measure electrical characteristics of a component using the pair of measuring elements;
a relative movement device configured to relatively move the pair of measuring elements and the holding table; and
a sorting and collecting device configured to separate and collect the component released from the pair of measurement elements by relatively moving the pair of measuring elements and the holding table by control of the relative movement device based on measurement results of the electrical characteristics of the component as measured by the measurement section, wherein
the relative moving device includes a holding table moving device configured to move the holding table, and
the sorting and collecting device includes a holding table movement control section configured to control the holding table moving device based on the measurement results so as to change the relative position of the holding table and the pair of measuring elements that have been separated from each other.

8. The inspection device according to claim 7, comprising
a main body including a first through-hole and a second through-hole formed with an interval between them, wherein
the holding table moving device moves the holding table above the first through-hole and the second through-hole of the main body, and
the holding body movement control section includes a storage section selection section that moves the holding table to a first position above the second through-hole and separated from a position above the first through-hole, and a second position above the first through-hole and separated from a position above the second through-hole.

9. An inspection device provided in a mounter that picks up a component supplied from a component supply device and mounts the component on a circuit board, the inspection device comprising:
a holding table configured to hold a component;
a measuring section provided with a pair of measuring elements configured to move towards and away from each other so as to grip and release the component, and configured to measure electrical characteristics of a component using the pair of measuring elements;
a relative movement device configured to relatively move the pair of measuring elements and the holding table; and
a sorting and collecting device configured to separate and collect the component released from the pair of measurement elements by relatively moving the pair of measuring elements and the holding table by control of the relative movement device based on measurement results of the electrical characteristics of the component as measured by the measurement section, wherein
the pair of measuring elements includes a fixed element that is fixed to the main body, and a movable element capable of moving away from and towards the fixed element, with each of the fixed element and the movable element including an opposing surface capable of gripping the component, and
the inspection device includes an air supply device configured to supply air to the opposing surface of the movable element when the pair of measuring elements are separated from each other.

* * * * *